(12) United States Patent
Neel

(10) Patent No.: US 11,169,107 B2
(45) Date of Patent: Nov. 9, 2021

(54) IMPEDANCE MEASUREMENT DEVICE

(71) Applicant: FOGALE NANOTECH, Nîmes (FR)

(72) Inventor: Christian Neel, Nîmes (FR)

(73) Assignee: FOGALE NANOTECH, Nîmes (FR)

( * ) Notice: Subject to any disclaimer, the term of this patent is extended or adjusted under 35 U.S.C. 154(b) by 0 days.

(21) Appl. No.: 16/755,407

(22) PCT Filed: Oct. 3, 2018

(86) PCT No.: PCT/EP2018/076915
§ 371 (c)(1),
(2) Date: Apr. 10, 2020

(87) PCT Pub. No.: WO2019/072665
PCT Pub. Date: Apr. 18, 2019

(65) Prior Publication Data
US 2020/0271608 A1  Aug. 27, 2020

(30) Foreign Application Priority Data

Oct. 10, 2017  (FR) ...................................... 1759481

(51) Int. Cl.
*G01N 27/22* (2006.01)
*B25J 19/02* (2006.01)

(52) U.S. Cl.
CPC .......... *G01N 27/226* (2013.01); *B25J 19/027* (2013.01)

(58) Field of Classification Search
CPC ..... B25J 19/027; G01R 27/2605; G01B 7/023
See application file for complete search history.

(56) References Cited

U.S. PATENT DOCUMENTS 4,454,468 A   6/1984  Colin et al.
5,065,105 A  11/1991  Bruere et al.
(Continued)

FOREIGN PATENT DOCUMENTS

FR    2756048 A1   5/1998

OTHER PUBLICATIONS

French Search Report from the corresponding French Patent Application No. 1759481, dated Jun. 27, 2018.
(Continued)

*Primary Examiner* — Alvaro E Fortich
(74) *Attorney, Agent, or Firm* — Greer, Burns & Crain, Ltd

(57) ABSTRACT

An electronic impedance measurement device:
  a branch, called measurement branch, including an impedance to be measured ($Z_m$), and;
  at least one branch, called reference branch, including an impedance ($Z_r$), called reference impedance;
  electronics, called detection electronics, configured to provide an error signal ($V_s$) dependent on an algebraic sum of a current ($I_r$) flowing in the at least one reference branch (104) and of a current ($I_m$) flowing in the measurement branch; and
  at least one adjustment structure, changing the current ($I_r$) in at least one of said reference branches in a manner inversely proportional to a control variable (k).

19 Claims, 7 Drawing Sheets

State of the Art

(56) References Cited

U.S. PATENT DOCUMENTS

| | | | |
|---|---|---|---|
| 6,429,685 B1* | 8/2002 | Stockstad | H03K 19/00384 326/27 |
| 2004/0008058 A1* | 1/2004 | Lee | H03K 17/962 327/58 |
| 2005/0007127 A1 | 1/2005 | Cram | |
| 2006/0097734 A1 | 5/2006 | Roziere | |
| 2006/0158200 A1* | 7/2006 | Eilersen | G01R 27/2605 324/667 |
| 2011/0307097 A1 | 12/2011 | Colledani et al. | |
| 2012/0105362 A1* | 5/2012 | Kremin | G06F 3/03545 345/174 |
| 2015/0164369 A1* | 6/2015 | Boverman | A61B 5/0531 324/605 |
| 2018/0236667 A1 | 8/2018 | Gombert et al. | |

OTHER PUBLICATIONS

International Search Report from the corresponding International Patent Application No. PCT/EP2018/076915, dated Dec. 19, 2018.
Kamcke, "Digitale Nullindikatoren für Wechselspannungsmeßbrüken", MeβTechnik, Jan. 11, 1985, pp. 37-40, Elektronic.
Bey, JR. et al., "Autonulling Mos Bridge for Sensor Applications," Annual International Conference of the IEEE Engineering in Medicine and Biology Society, Oct. 31, 1991, pp. 1595-1596, vol. 13, No. 4, IEEE, Orlando, Florida.

* cited by examiner

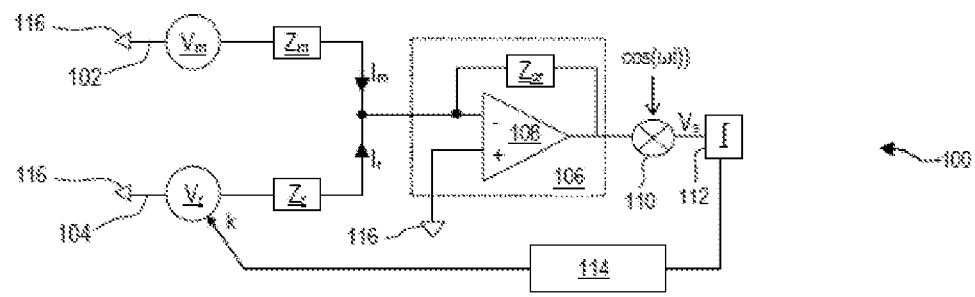
FIG. 1: State of the Art
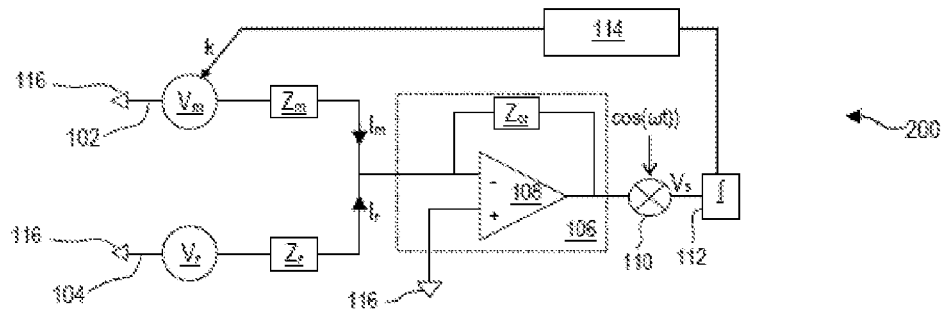
FIG. 2: State of the Art
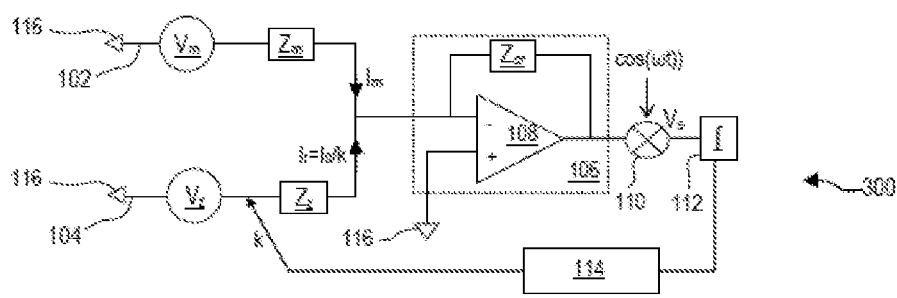
FIG. 3

IMPEDANCE MEASUREMENT DEVICE

BACKGROUND

The present invention relates to a device for measuring impedance, and in particular capacitive impedance in the context of an application for the capacitive detection of objects. It also relates to a device for the capacitive detection of objects utilizing such an impedance measurement device, for detecting the approach and/or the contact of an object. It also relates to an item of equipment and a robot, equipped with such a device.

The field of the invention is, non-limitatively, that of impedance measurement devices, and in particular those used in interfaces for the capacitive detection of nearby objects, in particular in the field of robotics.

Capacitive detection of an object, based on measuring the capacitance, called electrode-object capacitance, formed between a capacitive detection electrode and said object, has been known for some time. Document FR2756048 describes such a detection.

Generally, this capacitive detection utilizes a zero-method impedance measurement device, also called impedance measurement bridge. The measurement bridge comprises a branch, called measurement branch, comprising a source $V_m$, called measurement source, and the impedance to be measured, namely the impedance formed by the electrode-object capacitance, and a reference branch comprising a source $V_r$, called reference source, and an impedance, called reference impedance. The impedance measurement is carried out by balancing the measurement bridge such that the algebraic sum of the currents flowing in the two branches, or of the voltages at the terminals of the two branches, is zero.

A solution for balancing the bridge consists of changing the voltage of the reference source $V_r$ proportionally to a control variable k ($V_r = k \cdot V_0$), so as to compensate for the balancing error. For the capacitive detection of an object, this solution gives a measurement of the electrode-object capacitance $C_m$, and ipso facto requires an inversion in order to obtain the distance between the electrode and the object. Now, due to this inversion, it is necessary, with a digital system, to carry out a measurement of the electrode-object capacitance on an unnecessarily high number of bits, such as for example 2n bits when it is desired to quantify the distance on n bits. This is expensive to implement.

Another solution consists of changing the voltage of the measurement source $V_m$ proportionally to a control variable k ($V_m = k \cdot V_0$), so as to compensate for the balancing error. For the capacitive detection of an object, this solution gives a measurement proportional to the distance between the electrode and the object, and is therefore less expensive to implement. However, this solution cannot be parallelized, as it requires changing the voltage of the measurement branch for each measurement electrode and introduces leakage capacitance disturbances.

An aim of the present invention is to overcome the aforementioned drawbacks.

Another aim of the present invention is to propose a parallelizable device for measuring impedance that is less expensive to implement, in particular within the context of a capacitive detection of an object.

Another aim of the present invention is to propose a parallelizable device for measuring impedance which allows a more rapid detection within the context of a capacitive detection of an object.

SUMMARY

At least one of these aims is achieved with an electronic impedance measurement device comprising:

a branch, called measurement branch, comprising an impedance to be measured; and at least one branch, called reference branch, comprising an impedance, called reference impedance;

characterized in that it also comprises:

electronics, called detection electronics, configured to provide an error signal dependent on an algebraic sum of a current flowing in the at least one reference branch and of a current flowing in the measurement branch; and at least one means, called adjustment means, changing the current in at least one of said reference branches in a manner inversely proportional to a control variable.

It should be noted that if the currents are in phase opposition or have opposite polarity, the algebraic sum thereof corresponds to a difference.

According to embodiments, the control variable can be a numerical value, and/or generated by a numerical system.

In other words, unlike the devices of the state of the art in which the current is adjusted proportionally to a control variable, the device according to the invention changes the current in the reference branch in a manner inversely proportional to a control variable. This difference will be explained in more detail with reference to FIGS. 1 to 3.

Thus, the impedance measurement device according to the invention is parallelizable, as it does not need to change the voltage of the measurement branch. In addition, the device according to the invention is less expensive to implement, since where the devices of the state of the art give measurements that are inversely proportional to the impedance, the device according to the invention gives a measurement proportional to the impedance. As a result, the device according to the invention makes it possible to avoid an inversion operation, and consequently, the costs and time associated therewith.

In the present application, for the sake of simplicity, arguments are based on sinusoidal conditions with angular frequency signals ω the amplitudes of which are algebraic (V, $V_0$, $V_r$, etc.), and by "impedance" is meant the value of the real part and/or of the imaginary part of the impedance with, or without, taking account of the frequency/angular frequency.

In particular, in the present application, by "impedance Z":

with a pure capacitance of value "C", is meant Z=1/C or Z=1/(jωC);

with a pure inductance of value "L", is meant Z=L or Z=jωL; and with a pure resistance of value "R" is meant Z=R;

with "ω" the angular frequency and j the imaginary unit.

However, it is well understood that the invention can be implemented by using all kinds of alternative signals, (for example square-wave, triangular, etc.), and the same arguments are applicable.

In the present application, "object" denotes any object or person capable of being located in the environment of a sensor, and/or a device such as a robot equipped with a sensor.

In the present application, two alternating potentials are identical at a given frequency when they each comprise an alternating component identical at this frequency. Thus, at least one of the two potentials identical at said frequency can also comprise for example a DC component, and/or an AC component of a frequency different from said given frequency.

Similarly, two alternating potentials are different at the working frequency when they do not have an identical AC component at this working frequency.

In the present application, in order to avoid overloading the text, the term "ground potential" or "general ground potential" denotes a reference potential of the electronics (or of the device, such as a robot), which can be for example an electrical ground. This ground potential can correspond to an earth potential, or to another potential, connected or not to the earth potential.

Furthermore, it is recalled that, generally, objects that are not in direct electrical contact with a particular electrical potential (electrically floating objects) tend to polarize by capacitive coupling at the electrical potential of other objects present in their environment, such as for example earth or electrodes, if the surfaces of overlap between these objects and those of the environment (or the electrodes) are sufficiently large.

In the device according to the invention, for at least one reference branch, the adjustment means can change the amplitude of a voltage delivered to said reference branch, in a manner inversely proportional to the control variable.

In other words, the voltage delivered at the reference impedance present in said reference branch can be adjusted in a manner inversely proportional to the control variable.

In this case, according to a non-limitative embodiment example, the adjustment means can comprise an amplifier the gain of which varies in a manner inversely proportional to the control variable, and arranged downstream of a voltage source.

The voltage source can deliver an alternating voltage with a fixed amplitude, denoted for example $V_0$. The amplifier applies a gain G, inversely proportional to the control variable, denoted for example k. The voltage, denoted $V_r$, delivered to the reference impedance, denoted $Z_r$, is then $V_r \sim V_0/k$. In this case, the current, denoted $I_r$, flowing in the reference impedance $Z_r$, and thus in the reference branch, obeys the relationship: $I_r = V_r/Z_r \sim V_0/(k \cdot Z_r)$. The current is thus inversely proportional to the control variable k.

In particular, the adjustment means can comprise:
an amplifier, in particular inverting, and
at least one first digital potentiometer, used as input resistor of said amplifier, and the resistance of which is adjusted proportionally to the control variable.

In particular, said first digital potentiometer can be a digital potentiometer the resistance of which has the value $R_r(p) = k \cdot R$, with for example R corresponding to the value of the feedback resistance of the amplifier, to preserve a unitary gain. In this case, the gain G of the amplifier obeys the relationship $G \sim (1+1/k)$ for a non-inverting amplifier, and $G \sim 1/k$ for an inverting amplifier, with k the control variable.

In the case where an inverting amplifier is used, the voltage source preferably delivers an alternating voltage $V_0$ of the same polarity as, or in phase with, the voltage delivered to the measurement branch. In the case where a non-inverting amplifier is used, the voltage source preferably delivers a voltage $V_0$ of the opposite polarity to, or in phase opposition with, the voltage delivered to the measurement branch.

According to a particularly advantageous optional characteristic, the adjustment means can comprise at least one second digital potentiometer the resistance of which is controlled proportionally to the control variable, mounted in series with the first digital potentiometer, and having a higher resolution and/or a lower maximum resistance than said first potentiometer, in particular in a ratio of the order of 10.

Thus, it is possible to carry out an impedance measurement that is more precise and more accurate, by using a coarse approach with the first digital potentiometer, then a more precise approach with the second digital potentiometer.

For at least one reference branch, the adjustment means can change the reference impedance of said reference branch, in a manner proportional to the control variable.

In other words, the reference impedance present in said reference branch can be adjusted in a manner proportional to the control variable.

In this case, according to an embodiment example, the adjustment means can comprise:
a set of at least two impedances arranged in series, and
at least one, in particular several, controllable switch(es), each provided to short-circuit, or not, one of said impedances.

Thus, by changing the number of short-circuited impedances, it is possible to change the total impedance, in a manner proportional to the control variable.

According to a preferred example of implementation that is in no way limitative, the set of impedances can comprise n impedances of values $Z_i = Z \cdot 2^i$ with $i = 0 \ldots n-1$, and in particular n condensers of values $C_i = C \cdot 2i$ with $i = 0 \ldots n-1$.

In this case, the reference impedance obeys the following relationship:

$$Zr = \frac{(k.Z)}{2^n}$$

In addition, by encoding the value of k on n bits (with for example n=8), it is then possible to control the state of each switch by one bit.

According to embodiments, the device according to the invention can comprise several reference branches.

The device according to the invention can in particular comprise at least two reference branches comprising reference impedances of a different type.

For example, one of these reference branches can comprise a reference impedance of a purely resistive type, and the other one of these reference branches can comprise an impedance of a purely reactive, capacitive or inductive type.

It is thus possible to determine components of a type different from the impedance to be measured.

Alternatively or in addition, the device according to the invention can comprise at least two reference branches comprising reference impedances of the same type, and supplied by quadrature signals. In other words, each of these branches comprises a reference impedance that is either a resistive type or a reactive type.

Owing to the fact that these two reference branches are supplied in quadrature, the reference impedances of the same type behave as impedances of a different type. For example, a capacitance supplied by a quadrature voltage is "seen" as a resistance. As before, it is thus possible to determine components of a type different from the impedance to be measured.

As explained above, the device according to the invention can comprise detection electronics supplying an error signal ($V_s$) dependent on (or a function of, or proportional to) an algebraic sum of the current flowing in the at least one reference branch and of the current flowing in the measurement branch.

If the currents are in phase opposition or have opposite polarity, the algebraic sum corresponds to a difference.

This error signal ($V_s$) tends towards zero when the bridge is balanced.

This detection electronics can be produced partially or totally by analogue components, or by digital components, or also by a combination of digital components and analogue components.

In order to provide a voltage error signal that is dependent on a sum of currents, the detection electronics can comprise a current-to-voltage converter. This converter can comprise an amplifier of the transimpedance type, for example in the form of circuitry corresponding to an operational amplifier with a feedback impedance. This feedback impedance can be for example of an essentially resistive and/or capacitive type. Generally, it provides at the output a voltage $V=-Z\,I$ in complex notation, with I the input current and Z the negative feedback impedance.

In a preferred version, in particular adapted for measuring capacitive-type impedances, the detection electronics can comprise a charge amplifier connected at a junction point of the measurement branch with the at least one reference branch, between the impedance to be measured and the at least one reference impedance, and providing an error signal dependent on (or proportional to, at least in complex notation) the algebraic sum of the current of the measurement branch and of the current of the at least one reference branch.

An amplifier called "charge amplifier" is an amplifier of the transimpedance type, with an impedance of an essentially capacitive type as feedback impedance, optionally combined with an impedance of resistive type in parallel. It provides at the output a voltage proportional to the charge, or to the current, present at the input.

The device according to the invention can also comprise, arranged downstream of the detection electronics, an amplitude demodulator. This amplitude demodulator can comprise for example:
  an envelope detector, which carries out in a digital or analogue manner a rectification of the error signal followed by a low-pass filtering; or
  a synchronous demodulator, which carries out a multiplication of the error signal with a reference carrier wave, followed by a low-pass filtering.

This amplitude demodulator is intended to receive the error signal and to provide, in a digital or analogue manner, a measurement of the amplitude of this error signal.

The device according to the invention can also comprise an amplifier with a gain proportional to, and in particular equal, to the control variable.

This amplifier can be arranged downstream of the detection electronics or downstream of the amplitude demodulator.

This amplifier makes it possible to obtain an error signal proportional to the control variable, which makes it possible, with very few measurements with different control variables, or even with a single measurement, to determine the value of the impedance to be measured.

Alternatively, the device according to the invention can comprise a comparator arranged downstream of the detection electronics and receiving the error signal ($V_s$) provided for example by the charge amplifier. This comparator provides a binary alternating signal corresponding to the polarity of the error signal. This signal can be compared to a reference signal for determining the error sign (for example numerically or using a logic of the exclusive OR type). Such a comparator thus makes it possible to carry out a detection of the binary "by successive approximations" type, eliminating completely the need for a demodulation of the error signal.

The device according to the invention can also comprise an electronic module, called control module, providing the control variable as a function of the signal originating from the detection electronics, optionally after demodulation.

Such an electronic module can in particular be of a digital type, and can for example be realized by a microcontroller providing a signal on n bits to control, for example, either one or more digital potentiometer(s), or short-circuit switches of a set of impedances, mounted in series, as described above.

According to an implementation that is in no way limitative, the reference branch and the measurement branch can be supplied by one and the same source, optionally by use of a transformer or a resistive voltage divider (constituted by at least two cascade resistances).

According to a particularly preferred implementation, in particular in the case of a capacitive detection of objects:
  the impedance to be measured can be referenced to a general ground, in particular earth, and
  the current in the at least one reference branch can be referenced to an alternating electrical potential, called reference potential, different from said general ground at a working frequency;
said device comprising an alternating voltage source arranged between said reference potential and said general ground.

In this configuration, the impedance to be measured can be connected to a general ground, or in other words have a termination electrically connected to a general ground (or to earth). At least a part of the electronics of the device (including the at least one reference branch or the current of the at least one reference branch) can be referenced to the reference potential. The alternating voltage source can impose an alternating potential difference between this reference potential and the general ground.

In the case of a capacitive detection of objects utilizing capacitive measurement electrodes, the impedance to be measured is constituted by the capacitance between a measurement electrode and a nearby object, which is generally electrically referenced to the general ground or to earth. In this configuration, the measurement electrode is polarized at a potential corresponding to the reference potential. This reference potential can then be used as guard potential to electrically guard said measurement electrodes and avoid parasitic leakage capacitances with the environment, for example by means of guard electrodes polarized at said reference potential.

In this configuration, at least a part of the electronics, including the detection electronics and the charge amplifier, if applicable, can be electrically referenced to the reference potential, including the power supplies of components. Thus, the leakage capacitances are also eliminated in the components.

Of course, it is also possible to utilize electronics referenced (at the level of the power supplies thereof) to the ground potential for processing the signals or the currents in particular originating from the reference and measurement branches referenced to the reference potential.

The device according to the invention can be produced partially or totally from analogue components, or from digital components, or from a combination of digital components and analogue components.

According to a non-limitative version, the device according to the invention can be a capacitive impedance measurement device comprising an impedance to be measured of an essentially capacitive type.

Similarly, the device according to the invention can comprise a reference impedance of a capacitive or essentially capacitive type.

Such a version of the device according to the invention is particularly relevant within the context of a capacitive detection of objects, by measuring the impedance formed by a coupling capacitance between the object to be detected and one or more capacitive measurement electrodes.

According to another aspect of the same invention, a method is proposed for measuring impedance, in particular capacitive impedance, with an electronic impedance measurement device comprising:
  a branch, called measurement branch, comprising an impedance to be measured;
  at least one branch, called reference branch, comprising an impedance, called reference impedance;
characterized in that it comprises:
  a step of obtaining, with detection electronics, an error signal dependent on an algebraic sum of a current flowing in the at least one reference branch and of a current flowing in the measurement branch; and
  at least one iteration of a step, called adjustment step, changing the current in said at least one reference branch in a manner inversely proportional to a control variable.

In particular, the method according to the invention can comprise in terms of step(s) or characteristic(s), in isolation or combined, each of the characteristics of the impedance measurement device according to the invention, which will not be repeated here for the sake of brevity.

According to a first embodiment, the value of the control variable corresponding to the balance between the measurement branch and the at least one reference branch can be measured by a plurality of iterations.

According to another embodiment, the value of the control variable corresponding to a balance between the measurement branch and the at least one reference branch can be calculated starting from the value provided by at least one measurement carried out with the device according to the invention.

According to yet another aspect of the present invention, a capacitive device for the detection of an object is proposed comprising:
  at least one electrode, called measurement electrode, and
  at least one impedance measurement device according to the invention arranged to measure the capacitive impedance formed between said measurement electrode and said object.

In this case, the or each reference impedance is an impedance of purely capacitive type.

Of course, the capacitive detection device can comprise several measurement electrodes.

According to an embodiment, an impedance measurement device can be common to a plurality, or all, of the measurement electrodes. In this case, the capacitive detection device can comprise a polling means connecting said measurement device to each of said measurement electrodes, alternately or sequentially.

Alternatively or in addition, the capacitive detection device can comprise several measurement devices, each measurement device being common to a set of several measurement electrodes and connected alternately or sequentially to each of the measurement electrodes of said set.

Such a capacitive detection device can be incorporated, partially or totally, into a capacitive detection interface, or into an item of equipment for an appliance or a robot such as a shell- or skin-type casing part or a covering.

According to yet another aspect of the present invention, an item of equipment for a robot is proposed equipped with:
  at least one capacitive detection device according to the invention; and/or
  at least one impedance measurement device according to the invention.

Such an item of equipment can be removable or detachable.

Such an item of equipment can be flexible or rigid.

Such an item of equipment can be a casing part of the robot, such as a shell or a skin or also a covering.

Such an item of equipment can be a functional part, such as a functional head presented in the form of a tool or a tool holder.

According to yet another aspect of the present invention, a robot is proposed equipped with:
  an item of equipment according to the invention; and/or
  at least one capacitive detection device according to the invention; and/or
  at least one impedance measurement device according to the invention.

Such a robot can be a robotized arm, articulated or not.

Such a robot can be a humanoid robot.

Such a robot can be generally any motorized appliance or vehicle.

BRIEF DESCRIPTION OF THE DRAWINGS

Other advantages and characteristics will become apparent on examination of the detailed description of examples that are in no way limitative, and from the attached drawings in which:

FIGS. 1 and 2 are diagrammatic representations of impedance measurement devices of the state of the art;

FIG. 3 is a diagrammatic representation of the principle of an impedance measurement device according to the invention;

Figure 4:
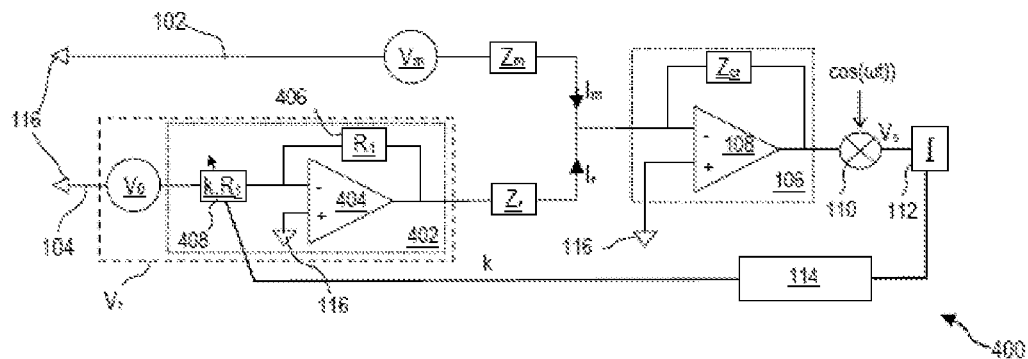
FIGS. 4-14 are diagrammatic representations of different embodiment examples of an impedance measurement device according to the invention.

It is well understood that the embodiments that will be described hereinafter are in no way limitative. Variants of the invention can in particular be envisaged comprising only a selection of characteristics described hereinafter in isolation from the other characteristics described, if this selection of characteristics is sufficient to confer a technical advantage or to differentiate the invention with respect to the state of the prior art. This selection comprises at least one, preferably functional, characteristic without structural details, or with only a part of the structural details if this part alone is sufficient to confer a technical advantage or to differentiate the invention with respect to the state of the prior art.

In particular, all the variants and all the embodiments described can be combined together if there is no objection to this combination from a technical point of view.

In the figures, elements common to several figures keep the same reference.

The embodiments are described using harmonic signals, but it is well understood that the invention can be implemented with all kinds of alternative signals, (square-wave, triangular, etc.).

FIG. 1 is a diagrammatic representation of the principle of a first type of impedance measurement device according to the state of the art.

The impedance measurement device 100, also called impedance measurement bridge, comprises a first branch 102, called measurement branch. The measurement branch 102 comprises an impedance, denoted $Z_m$, the value of which is to be measured. The measurement branch 102 is excited by an alternating electrical source $V_m(t)=V_m \cos(\omega t)$, of fixed amplitude $V_m$, and angular frequency $\omega$.

The impedance measurement device 100 also comprises a first branch 104, called reference branch. The reference branch 104 comprises an impedance, denoted $Z_r$. This impedance $Z_r$ is preferably of the same type (resistive, capacitive or inductive) as at least a component of the impedance to be measured $Z_m$. The reference branch 104 is excited by a variable alternating electrical source $V_r(t)=V_r \cos(\omega t+\pi)$, of amplitude $V_r$ and in phase opposition with respect to the alternating electrical source $V_m(t)$. The amplitude of the voltage delivered by the reference source $V_r$ is adjusted in a manner proportional to a control variable k, such that $V_r=k \cdot V_0$, with $V_0$ an alternating electrical source having a fixed amplitude.

The measurement device 100 comprises detection electronics 106 comprising an amplifier 108 of the transimpedance type (or more simply "transimpedance amplifier") the "−" terminal of which is connected to a junction point of the measurement 102 and reference 104 branches, between the measurement $Z_m$ and reference $Z_r$ impedances. A feedback impedance $Z_{cr}$ connects the output of the transimpedance amplifier 108 to the "−" input thereof.

The detection electronics 106 can optionally be combined with a synchronous demodulation unit 110 using as a reference signal an alternating electrical signal of a similar form to the signals to be demodulated, i.e. in the examples presented of type $\cos(\omega t)$, and with an integration unit 112.

The transimpedance amplifier 108 provides an output signal, or error signal, denoted $V_s(t)$ as a function of time t, proportional to the algebraic sum of the current $I_m(t)$ of the reference branch 102 and of the current $I_r(t)$ of the measurement branch 104. This error signal is demodulated by the unit 110 to extract the amplitude $V_s$ therefrom, and integrated by the integrator 112. The integrator 112 makes it possible to realize a feedback loop of the proportional-integral type (PI) which avoids the effects of lag.

In order to obtain an error signal $V_s(t)$ in phase with the signals of the electrical sources $V_m(t)$ and $V_r(t)$, that is easier to process, it is preferable to use a feedback impedance $Z_{cr}$ of the same type as the measurement impedance $Z_m$. In particular, if the measurement impedance $Z_m$ is of a capacitive or essentially capacitive type, it is preferable to utilize a transimpedance amplifier 108 with a feedback impedance $Z_{cr}$ of a capacitive or essentially capacitive type, in which case the transimpedance amplifier 108 is called "charge amplifier" 108.

The signal originating from the integrator 112 is provided to a control module 114, which can be for example a microcontroller. The control module 114 provides a control variable, denoted k, which will modulate the amplitude $V_r$ of the voltage provided by the variable reference source $V_r(t)$. The objective is to cancel out the algebraic sum of the reference current $I_r(t)$ and of the current $I_m(t)$, and therefore to cancel out the error signal $V_s(t)$ provided by the transimpedance amplifier 108, at any time t.

The measurement branch 102, the reference branch 104, as well as the "+" terminal of the transimpedance amplifier 108 are connected, in the example shown in FIG. 1, at a reference potential 116.

In balance, the currents in the reference 104 and measurement 102 branches verify the following relationship at any time:

$$I_r(t)+I_m(t)=0$$

I.e.

$$V_r(t)/Z_r=-V_m(t)/Z_m$$

$$Z_m=-(V_m(t)/V_r(t)) \cdot Z_r$$

Taking account of the fact that the voltage sources $V_r(t)$ and $V_m(t)$ are in phase opposition, and therefore have opposite polarity, this relationship can be written, in amplitudes:

$$Z_m=(V_m/V_r) \cdot Z_r$$

Thus, for a value $k_e$ of the control variable k corresponding to balance:

$$Z_m=(V_m/k_e \cdot V_0) \cdot Z_r.$$

It will be easily understood that the impedance $Z_m$ is inversely proportional to the control variable k. As a result, starting from the value $k_e$, it is necessary to carry out a mathematical inversion operation in order to determine $Z_m$.

Now, to obtain a value for $Z_m$ with accuracy under n bits after inversion of k, it is necessary to determine k with accuracy of 2 n bits, which is expensive.

A second type of known impedance measurement device exists, an example of which is shown in FIG. 2, which makes it possible to overcome this problem of cost associated with the device 100.

FIG. 2 is a diagrammatic representation of the principle of a second type of impedance measurement device according to the state of the art.

The impedance measurement device 200 comprises all the elements of the device 100 of FIG. 1.

Unlike the device 100 of FIG. 1, in the device 200 of FIG. 2, the source $V_r$ exciting the reference branch 104 is of fixed amplitude and it is the source $V_m$ exciting the measurement branch 102 that has an amplitude that can be varied proportionally to the control variable k, and the control module 114 controls this source $V_m$ and not the source $V_r$.

In other words, in the device 200 of FIG. 2, $V_m=k \cdot V_0$, with $V_0$ an alternating electrical source with fixed amplitude and k the control variable delivered by the control module 114.

In balance condition, still:

$$I_r(t)+I_m(t)=0$$

I.e.

$$V_r(t)/Z_r=-V_m(t)/Z_m$$

Taking account of the fact that, as above, the voltage sources $V_r(t)$ and $V_m(t)$ are in phase opposition, and therefore have opposite polarity, this relationship can be written, in amplitudes:

$$Z_m=(V_m/V_r) \cdot Z_r$$

Thus, for a value $k_e$ making it possible to obtain balance:

$$Z_m=(V_m/k_e \cdot V_0) \cdot Z_r.$$

It is understood that the impedance $Z_m$ is proportional to the control variable k.

As a result, starting from the value $k_e$, it is not necessary to carry out a mathematical inversion operation in order to determine $Z_m$, unlike the device 100 of FIG. 1.

The device 200 of FIG. 2 is therefore less expensive than the device 100 of FIG. 1.

However, the device 200 of FIG. 2 cannot be parallelized for a plurality of impedances to be determined because, as the source $V_m$ is located on the measurement branch 102, it cannot be common to all the impedances to be determined.

In addition, in a capacitive detection application the impedances to be determined are purely capacitive impedances between the measurement electrodes and an object to be detected. Now, it is not possible to excite the measurement electrodes at different potentials, because two adjacent measurement electrodes excited at different potentials generate between them a parasitic capacitive coupling and therefore leakage capacitances which interfere with the capacitive detection.

The invention makes it possible to overcome the drawbacks of each of the devices of FIGS. 1 and 2. In particular, the impedance measurement device according to the invention is:

less expensive than the device 100 of FIG. 1, and
can be parallelized, unlike the device of FIG. 2.

FIG. 3 is a diagrammatic representation of the principle of the impedance measurement device according to the invention.

The impedance measurement device 300 of FIG. 3 comprises all the elements of the device 100 of FIG. 1.

Unlike the device 100 of FIG. 1, in the device 300 of FIG. 3, the value of the current $I_r$ in the reference branch is adjusted in a manner inversely proportional to the control variable k provided by the control module 114, so that, in amplitude, $I_r = I_0/k$ with $I_0$ a reference current amplitude value.

Under these conditions, the output voltage of the transimpedance amplifier 108, or error signal $V_s$ has the value:

$$V_s(t) = -Z_{cr}[i_m(t) + i_r(t)] = -Z_{cr}[V_m/Z_m + I_0/k]$$

It is possible to use this equation to determine directly the impedance to be measured $Z_m$ as a function of the error signal $V_s$ and the applied control variable k, with one or more measurements.

It is also possible to seek a balance condition, corresponding to a zero-error signal $V_s(t) = 0$ at any time t. For this, it is necessary to cancel out the sum of the currents:

$$I_r(t) + I_m(t) = 0$$

In order to be able to cancel out the sum of the currents, it is necessary for them to be in phase opposition or have opposite polarity. In this case, the following may be written, in amplitudes:

$$I_0/k = V_m/Z_m$$

$$Z_m = (k \cdot V_m)/I_0$$

Thus, for a value $k_e$ making it possible to obtain the balance:

$$Z_m = (k_e \cdot V_m)/I_0.$$

It is therefore understood that the impedance $Z_m$ is proportional to the control variable k.

In addition, as the voltage of the source $V_m$ exciting the measurement branch 102 has a fixed amplitude, or more precisely fixed amplitude with respect to the control variable k or independent of this control variable k, the device 300 of FIG. 3 can be parallelizable for measuring a plurality of impedances in turn, without the need to change the source $V_m$, and without introducing parasitic impedances.

Furthermore, as explained above, the transimpedance amplifier is produced in the form of circuitry corresponding to an operational amplifier with a feedback impedance. Owing to the very principle of the operation of an operational amplifier, it follows that the "+" and "−" inputs of this transimpedance amplifier are at the same potential. As the "+" input is at the reference potential 116, the impedance to be measured $Z_m$ is also electrically connected to the reference potential 116. The voltage of the source $V_m$ is therefore found at the terminals of the impedance to be measured $Z_m$.

Thus, according to the invention, the voltage $V_m$ at the terminals of the impedance to be measured $Z_m$ and the current $I_m = V_m/Z_m$, passing through this impedance and more generally the measurement branch are independent of the control variable k and can be kept constant or with a fixed amplitude during the measurements. Moreover, the voltage at the terminals of the impedance to be measured $Z_m$ can be perfectly managed and known, since this may be directly the voltage of the source $V_m$.

FIG. 4 is a diagrammatic representation of a first embodiment example of an impedance measurement device according to the invention.

The impedance measurement device 400 of FIG. 4 comprises all the elements of the device 300 of FIG. 3.

In the example shown in FIG. 4, the value of the current $I_r$ in the reference branch 104 is adjusted in a manner inversely proportional to the control variable k, by adjusting the amplitude of the voltage supplied to the reference branch 104, in a manner inversely proportional to the control variable k.

To this end, the device 400 utilizes, on the reference branch 104, a variable voltage source $V_r$ delivering a voltage the amplitude of which is inversely proportional to the control variable k.

The voltage source $V_r$ comprises an alternating voltage source with fixed amplitude $V_0$ combined with an amplification stage 402, the gain of which is inversely proportional to the control variable k.

In particular, the amplification stage 402 comprises an operational amplifier 404 of which:

the "+" input is connected to the reference potential 116; and the "−" input is connected to the output thereof by a feedback resistor 406, of value $R_1$.

In addition, the "−" input is connected to an input resistor 408 the value of which is adjusted in a manner proportional to the control variable k. In particular, the value of the input resistor is equal to $k \cdot R_1$. The input resistor 408 can be a digital potentiometer the value of which is adjusted in a manner proportional to the control value k.

Under these conditions, the amplification stage 402 carries out a negative gain amplification G, the value of which obeys the following relationship:

$$G = -R_1/(k \cdot R1) = -1/k$$

As a result, the voltage provided by the variable voltage source $V_r$ to the reference branch 104 obeys the following relationship:

$$V_r(t) = -V_0(t)/k$$

It is deduced therefrom that the current $I_r$ in the reference branch obeys the following relationship:

$$I_r(t) = \frac{V_r(t)}{Z_r} = \frac{V_0(t)}{k \cdot Z_r}$$

As a result, the current $I_r$ is adjusted in a manner inversely proportional to the control variable k.

In balance, $I_r(t)+I_m(t)=0$. The following is directly deduced therefrom:

$$-\frac{V_0(t)}{k_{\cdot e} \cdot Z_r} = -I_m(t) = -\frac{V_m(t)}{Z_m}$$

I.e. in amplitudes:

$$Z_m = \frac{k_{\cdot e} \cdot Z_r V_m}{V_0}$$

Thus, the impedance to be measured $Z_m$ is determined in a manner directly proportional to the control variable k. It is therefore not necessary to carry out an inversion operation.

It will be noted that in this configuration, owing to the presence of the inverter amplification stage 402 used to generate the source $V_r$ of the reference branch, the alternating voltage sources $V_0$ of the reference branch and $V_m$ of the measurement branch must be in phase or have the same polarity to be able to cancel out the sum of the currents.

In the particular case where all the impedances are purely capacitive impedances, i.e. $Z_m=1/C_m$ and $Z_r=1/C_r$:

$$\frac{1}{C_m} = \frac{k_e \cdot V_m}{V_0} \frac{1}{C_r}$$

Within the context of a capacitive detection application, the capacitance $C_m$ represents the capacitance formed by a capacitive measurement electrode and an object. In this case, the distance D separating said measurement electrode from said object is proportional to the impedance value formed by this capacitance $C_m$ according to the following relationship:

$$D = \varepsilon_0 \varepsilon_r S \frac{1}{C_m}$$

with $\varepsilon_0, \varepsilon_r$ the permittivities of the free space and of the interface material respectively, and S the surface of overlap of the measurement electrode and the object.

It is deduced therefrom that the distance D obeys the following relationship:

$$D = \varepsilon_0 \varepsilon_r S \frac{k_e \cdot V_m}{V_0} \frac{1}{C_r}$$

It can be clearly seen that the distance D is directly proportional to the control variable k. Thus, the distance D is proportional to the value k making it possible to obtain balance.

Figure 5:
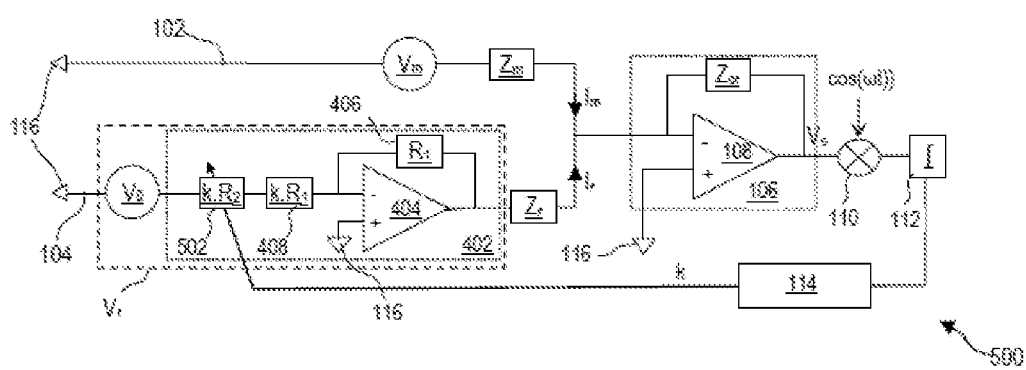

FIG. 5 is a diagrammatic representation of a second embodiment example of an impedance measurement device according to the invention.

The impedance measurement device 500 of FIG. 5 comprises all the elements of the device 400 of FIG. 4.

Unlike the device 400, in the device 500, the gain stage 402 comprises in addition to the digital potentiometer 408, a second digital potentiometer 502, in series with the first digital potentiometer 408, the value of which can be adjusted in a manner proportional to the control variable k.

In particular, the second digital potentiometer 502 can have a value given by the relationship $k \cdot R_2$.

The resistances $R_1$ et $R_2$ can be chosen such that the adjustment step of the second digital potentiometer is smaller compared with the adjustment step of the first digital potentiometer 408. Thus, it is possible to carry out a more accurate measurement of the impedance $Z_m$.

In particular, it is possible to carry out a first phase of iterations with a large adjustment step with the first digital potentiometer 408, then a second phase of iterations with a fine adjustment step with the second digital potentiometer 502.

For example $R_2=R_1/10$, which makes it possible to have an adjustment step ten times smaller, and therefore an accuracy 10 times greater, with the second digital potentiometer 502.

Of course, the invention is not limited to one or two digital potentiometers, and it is possible to use a number of digital potentiometers greater than or equal to 1.

Figure 6:
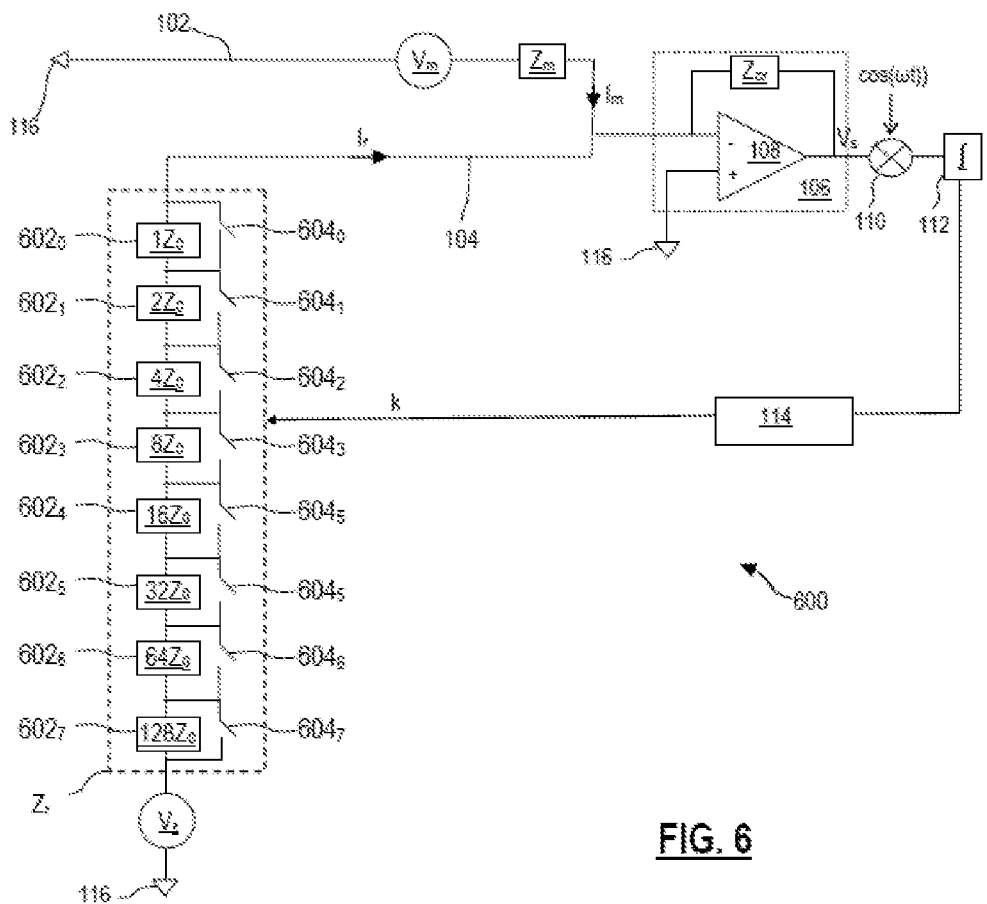

FIG. 6 is a diagrammatic representation of another embodiment example of an impedance measurement device according to the invention.

The impedance measurement device 600 of FIG. 6 comprises all the elements of the device 300 of FIG. 3.

In the example shown in FIG. 6, the value of the current $I_r$ in the reference branch 104 is adjusted in a manner inversely proportional to the control variable k, by adjusting the value of the reference impedance $Z_r$ of the reference branch 104, in a manner proportional to the control variable k.

To this end, the reference impedance $Z_r$ is formed by a set of eight impedances $602_0$-$602_7$, mounted in series, and of respective values $2^n \cdot Z_0$, with n=0 ... 7. Thus, the reference impedance $Z_r$ is formed by eight impedances $602_0$-$602_7$ having respective values $Z_0$, $2Z_0$, $4Z_0$, $8Z_0$, $16Z_0$, $32Z_0$, $64Z_0$ and $128Z_0$. Each impedance 602 can be short-circuited by a switch, $604_0$-$604_7$ respectively.

The control variable k is a value provided on eight bits and each switch $604_0$-$604_7$ is controlled by one bit of the control variable such that when the bit is equal to 0 the switch is open and when the bit is equal to 1 the switch is closed. The value of k is therefore written in binary on the configuration of the switches $604_0$-$604_7$. Under these conditions, the value of the impedance $Z_r$ is:

$$Z_r = Z_0 \cdot k/2^n$$

As a result, $Z_r$ varies in a manner proportional to the control variable k.

In balance, $I_r(t)+I_m(t)=0$. It is directly deduced therefrom that:

$$\frac{V_r(t)}{k_e \cdot (Z_0/2^n)} = -I_m(t) = -\frac{V_m(t)}{Z_m}$$

Taking account of the fact as above, that the voltage sources $V_r(t)$ and $V_m(t)$ are in phase opposition, and therefore have opposite polarity, this relationship can be written, in amplitudes:

$$Z_m = k_e . Z_0 . V_m \frac{1}{V_r.2^n}$$

Thus, the impedance to be measured $Z_m$ is determined in a manner directly proportional to the control variable k. It is therefore not necessary to carry out an inversion operation.

In the particular case where all the impedances are purely capacitive impedances, i.e. $Z_m = 1/C_m$ and $Z_0 = 1/C_0$:

$$\frac{1}{C_m} = \frac{1}{C_0} \frac{k_e . V_m}{V_r.2^n}$$

Within the context of a capacitive detection application, and by using the relationship linking the distance to the capacitance $C_m$, it is deduced therefrom that the distance D obeys the following relationship:

$$D = \varepsilon_0 \varepsilon_r S \frac{1}{C_0} \frac{k_e . V_m}{V_r.2^n}$$

It can be clearly seen that the distance D is directly proportional to the control variable k. Thus, the distance D is proportional to the value $k_e$ allowing balance to be obtained.

Figure 7:
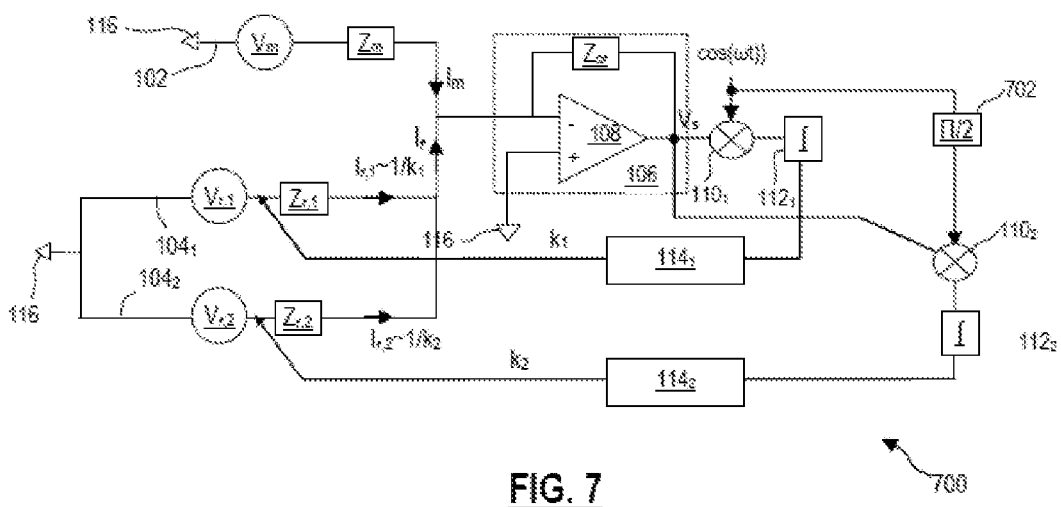

FIG. 7 is a diagrammatic representation of another embodiment example of an impedance measurement device according to the invention.

The impedance measurement device 700 of FIG. 7 comprises all the elements of the device 300 of FIG. 3.

Unlike the device 300, the device 700 comprises two branches referenced 104₁ and 104₂.

Each reference branch 104₁ and 104₂ is balanced according to any one of the principles described with reference to FIGS. 4-6. Each reference branch 104₁, 104₂ comprises an alternating excitation, $V_{r,1}$ and $V_{r,2}$ respectively, and a reference impedance $Z_{r,1}$ and $Z_{r,2}$ respectively.

The device 700 makes it possible for example to measure different components (active and reactive) of the impedance to be measured $Z_m$. The reference impedances $Z_{r,1}$, $Z_{r,2}$ each correspond respectively to an impedance component to be measured $Z_m$. As a result, they introduce a lag between the voltage and the current in their reference branch, which makes it possible to compensate for a component of the current of the measurement branch with a similar lag. For example, if the impedance to be measured comprises resistive and capacitive components, reference impedances $Z_{r,1}$, $Z_{r,2}$ are used, of a resistive and capacitive type respectively. Similarly, it is possible to measure a component of an inductive type with a reference impedance of inductive type.

With each reference branch 104₁, 104₂ is associated a control module, respectively 114₁ and 114₂, providing to each branch a control variable, $k_1$ and $k_2$ respectively, used to adjust the value of the current in each branch, $I_{r,1}$ and $I_{r,2}$ respectively in an inversely proportional manner such that $I_{r,1} \sim 1/k_1$ and $I_{r,2} \sim 1/k_2$.

With each branch 104₁, 104₂ is associated a synchronous demodulation unit, 110₁ and 110₂ respectively, and an integration unit, 112₁ and 112₂ respectively.

In this configuration, the balance of the bridge is achieved when the algebraic sum of the current $I_m$ of the measurement branch 102 and of the currents of all the reference branches 104₁ and 104₂ is zero at all times:

$$I_m(t) + I_{r,1}(t) + I_{r,2}(t) = 0.$$

When the impedances $Z_{r,1}$ and $Z_{r,2}$ are of a different type, and correspond to the different components of the impedance to be measured $Z_m$, the excitations $V_{r,1}$ and $V_{r,2}$ are in phase.

It is also possible, for detecting different components (resistive and reactive) of the impedance to be measured $Z_m$, to use impedances $Z_{r,1}$ and $Z_{r,2}$ of the same type, namely resistive or capacitive or also inductive, and phase-shifted excitation sources $V_{r,1}$ and $V_{r,2}$ (for example in quadrature), to reproduce the lag of the currents of the reference branches that would be generated by reference impedances of a different type.

In all cases, a phase-shift unit 702 is used to apply a phase shift of Π/2 to the carrier wave for the synchronous demodulation for one of the two branches 104₁ and 104₂, and thus to detect the phase and quadrature components thereof. In the example of FIG. 7, the demodulation unit 702 is used for the branch 104₂.

Of course, the invention is not limited to one or two reference branches, and it is possible to use a number of reference branches greater than or equal to 1.

Figure 8A:
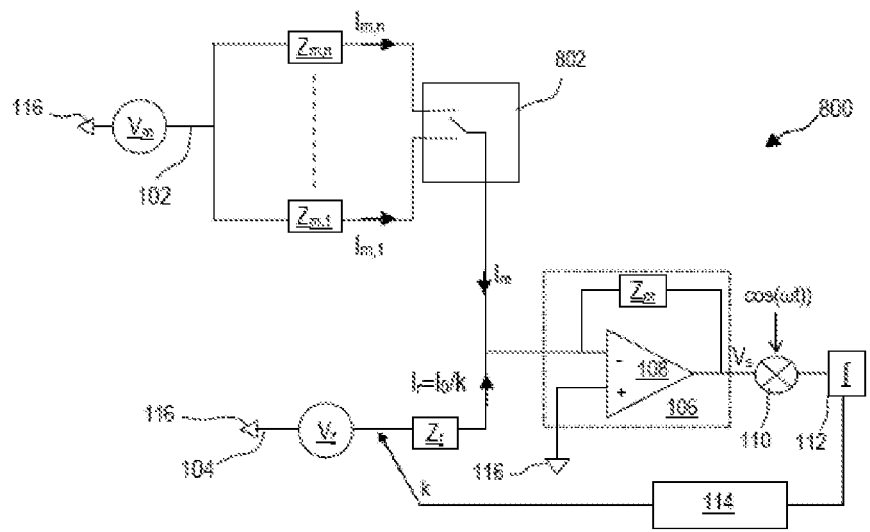
Figure 8B:
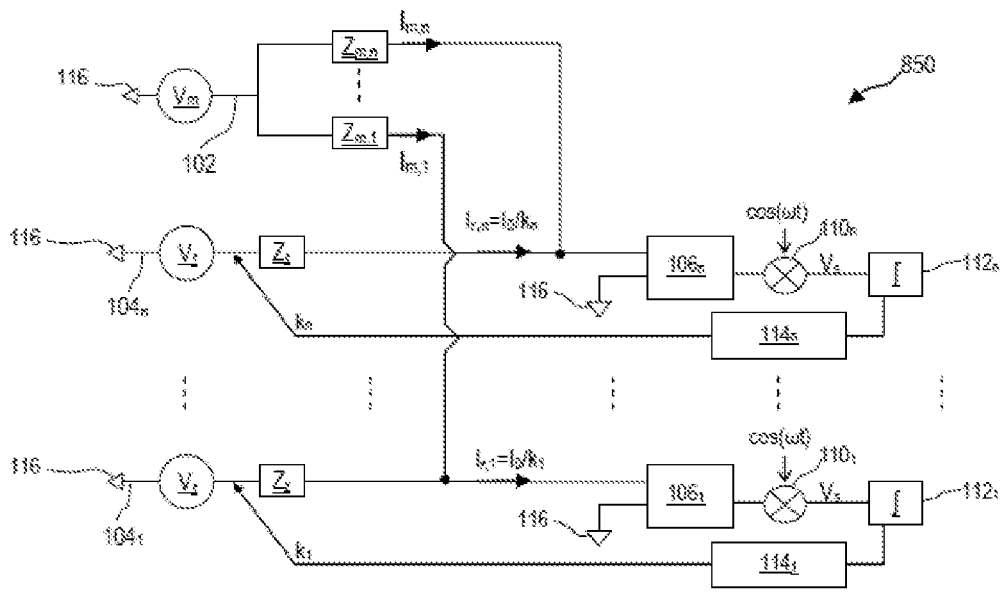

FIG. 8a and FIG. 8b are diagrammatic representations of impedance measurement devices according to the invention making it possible to measure a plurality of impedances $Z_{m,1}$-$Z_{m,n}$.

The impedance measurement device 800 of FIG. 8a comprises all the elements of the device 300 of FIG. 3.

Unlike the device 300, the device 800 makes it possible to measure, in turn or sequentially, a plurality of impedances $Z_{m,1}$-$Z_{m,n}$.

To this end, the device 800 comprises a polling means 802 making it possible to selectively connect the impedances to be measured $Z_{m,1}$-$Z_{m,n}$ to the detection electronics 106 and to the reference branch 104. In the example shown, the source $V_m$ of the measurement branch 102 is common to all the impedances to be measured. The polling means 802 can comprise switches, controllable for example by the control module 114, and making it possible to connect the detection electronics 106 to each of the impedances $Z_{m,i}$ to be measured in turn.

Preferably, the polling means 802 makes it possible to connect the impedances to be measured $Z_{m,1}$-$Z_{m,n}$ either to the detection electronics 106 or to the reference potential 116. This is particularly important if the impedances to be measured $Z_{m,i}$ are capacitive, to avoid parasitic couplings.

For each impedance $Z_{m,i}$, as above, the balance condition is given by the relationship $I_{m,i}(t) + I_r(t) = 0$, with $I_{m,i}$ the current passing through this impedance $Z_{m,i}$.

As explained above, the voltage at the terminals of the impedances to be measured $Z_{m,i}$ is identical and corresponds to the voltage; in the diagram shown, to the voltage source $V_m$. This property is very important to be able to measure a plurality of impedances $Z_{m,i}$ without parasitic electrical couplings between them, in particular when they are capacitive impedances.

The device 800 can be combined with each of the devices in FIGS. 4-7.

The impedance measurement device 850 of FIG. 8b comprises all the elements of the device 300 of FIG. 3.

Unlike the device 300, the device 850 makes it possible to measure, in parallel or simultaneously, a plurality of impedances $Z_{m,i}$-$Z_{m,n}$, with a plurality of independent parallel measurement paths.

To this end, it comprises a plurality of impedance measurement devices 300 each constituting a measurement path, for example according to the embodiments of FIGS. 4-7, operating in parallel.

Each impedance $Z_{m,i}$-$Z_{m,n}$ is connected to separate detection electronics $106_1$-$106n$ and constitutes, with a separate reference branch $104_1$-$104_n$, a separate bridge.

The value of the current $I_{r,i}$ in each reference branch $104_i$ is adjusted in a manner inversely proportional to a separate control variable $k_i$ provided by a separate control module $114_i$ (or a common control module 114), so as to determine a balance condition:

$$I_{r,i}(t)+I_m(t)=0$$

According to a particularly advantageous embodiment, the device 850 comprises a source $V_m$ common to all the impedances to be measured. Thus, all the impedances to be measured $Z_{m,1}$-$Z_{m,n}$ are polarized at the same potential, which is essential when for example these impedances to be measured are capacitances between capacitive measurement electrodes and an object.

Furthermore, the device 850 allows measurements that are independent, in parallel, or simultaneous, or asynchronous, of all the impedances $Z_{m,1}$-$Z_{m,n}$.

Of course, the different measurement paths of the device 850 can be realized in any manner, in particular with separate components and/or common components for each measurement path.

The device 850 can be combined with each of the devices in FIGS. 4-8a.

In particular, certain or all of the measurement paths of the device 850 can comprise a polling means 802 as shown in FIG. 8a for sequentially measuring a plurality of impedances. Furthermore, the device can comprise a source $V_m$ common to all the impedances to be measured, sequentially and/or with parallel measurement paths.

Figure 9:
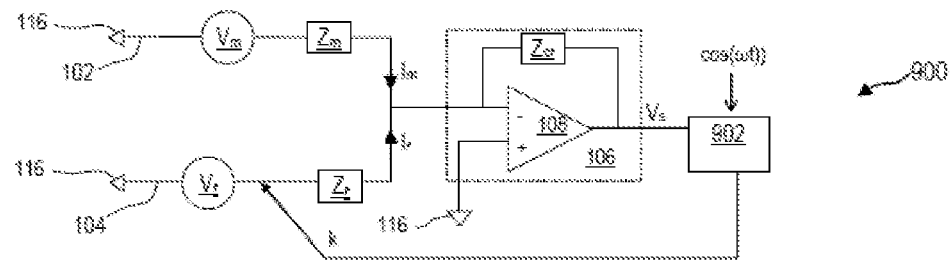

FIG. 9 is a diagrammatic representation of another embodiment example of an impedance measurement device according to the invention.

The impedance measurement device 900 of FIG. 9 comprises all the elements of the device 300 of FIG. 3.

Unlike the device 300, in the device 900 the synchronous demodulation unit 110, the integration unit 112 and the control module 114 are integrated in a microcontroller 902.

Alternatively, the microcontroller 902 can calculate a value of the impedance to be measured $Z_m$ starting from one or more measurements of an error signal $V_s$ as explained with respect to FIG. 3, without reproducing the operation of a feedback loop.

The device 900 can be combined with each of the devices in FIGS. 4-8.

Figure 10:
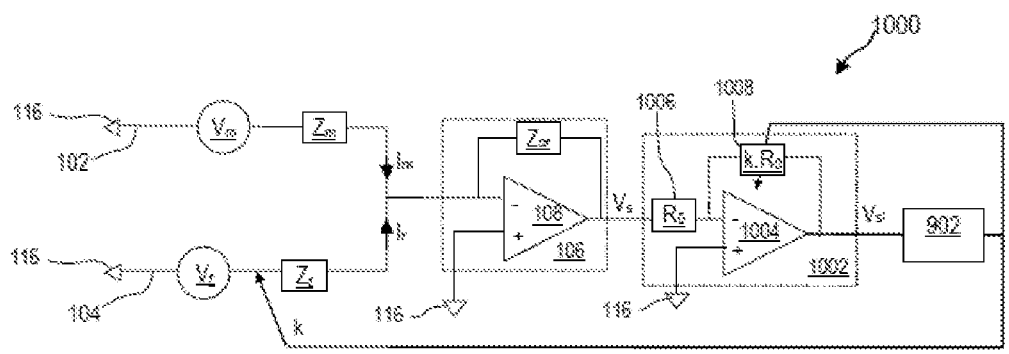

FIG. 10 is a diagrammatic representation of another embodiment example of an impedance measurement device according to the invention.

The impedance measurement device 1000 of FIG. 10 comprises all the elements of the device 900 of FIG. 9.

The impedance measurement device 1000 also comprises a linearization amplifier 1002 placed downstream of the detection electronics 106. This linearization amplifier 1002 can receive the alternating signal $V_s(t)$ at the input, as originating from the transimpedance amplifier 108. It can also be implemented in a device with a demodulator 110, such as the device 300, and receive the demodulated amplitude signal $V_s$ at the input.

The linearization amplifier 1002 has a gain $G_l$ which varies in a manner proportional to the control variable k.

To this end, it can be produced in the form of an inverting amplifier with an operational amplifier 1004 with an input resistor 1006 for example having a value $R_O$ and a feedback resistor 1008 of the digital potentiometer type, the resistance $R_p(k)$ of which varies linearly according to the digital control variable k: $R_p(k)=kR_O$.

The gain of the linearization amplifier 1002 is then written:

$$G_l=-k \cdot R_O/R_O=-k$$

By using the expression of the error signal $V_s$ established with respect to FIG. 3, at the output of the linearization amplifier 1002 a linearized error signal $V_{sl}$ is obtained:

$$V_{sl}(t)=k \cdot Z_{cr}[V_m(t)/Z_m+I_o(t)/k]=k \cdot V_m(t)Z_{cr}/Z_m+I_o(t)]$$

The corresponding amplitude of the linearized error signal, taking account of the fact that the currents in the measurement and reference branches are in phase opposition, or have opposite polarity, is:

$$V_{sl}=k \cdot V_m Z_{cr}/Z_m-I_o$$

A linearized error signal $V_{sl}$ is then obtained, which depends linearly on the control variable k. This linearized error signal $V_{sl}$ can advantageously be used by a microcontroller 902 to calculate a value of the impedance to be measured $Z_m$ starting from one or more measurements of the error signal $V_s$. It can also be used in closed loop operation (digital or analogue) to ensure rapid convergence.

Figure 11:
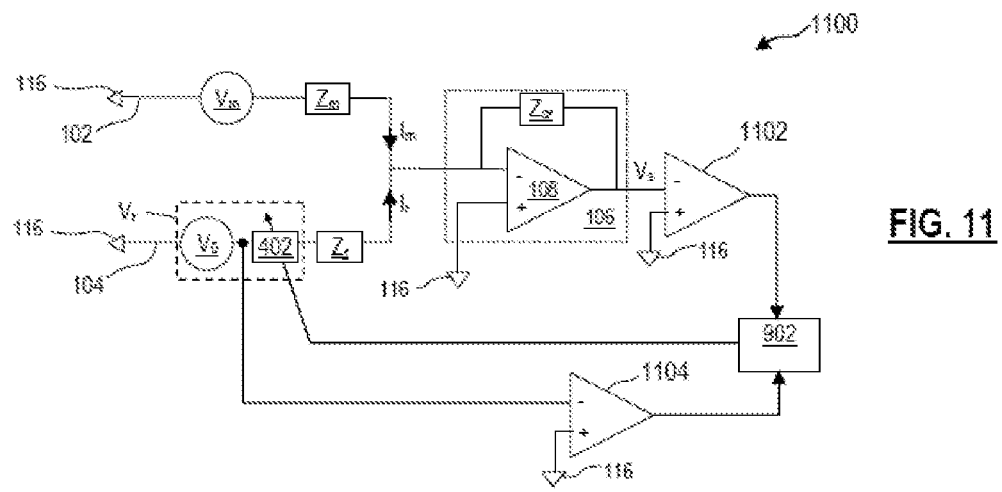

FIG. 11 is a diagrammatic representation of another embodiment example of an impedance measurement device according to the invention.

The impedance measurement device 1100 of FIG. 11 comprises all the elements of the device 900 of FIG. 9.

In the device 1100 of FIG. 11, the microcontroller 902 does not carry out a synchronous demodulation.

Instead, the device 1100 comprises in addition a first comparator 1102 arranged between the transimpedance amplifier 108 and the microcontroller 902 and a second comparator 1104 arranged between the voltage source of fixed amplitude $V_0$ of the reference branch 104 and the microcontroller 902.

The comparator 1102 arranged at the output of the transimpedance amplifier 108 only detects the sign of the alternating measurement signal $V_s$ provided by the transimpedance amplifier 108, namely negative or positive. Depending on the error sign given by the amplitude of the output signal $V_s$, at the output of the comparator 1102 an alternating signal is obtained in phase or in phase opposition with a reference signal originating from the source $V_0$, and discretized by the comparator 1104. It is then possible simply to detect this phase condition, for example with the microprocessor 902, and carry out a measurement of the "by successive approximations" type, completely eliminating the need for demodulation of the error signal $V_s$.

The device 1100 can be combined with each of the devices in FIGS. 4-8.

Figure 12:
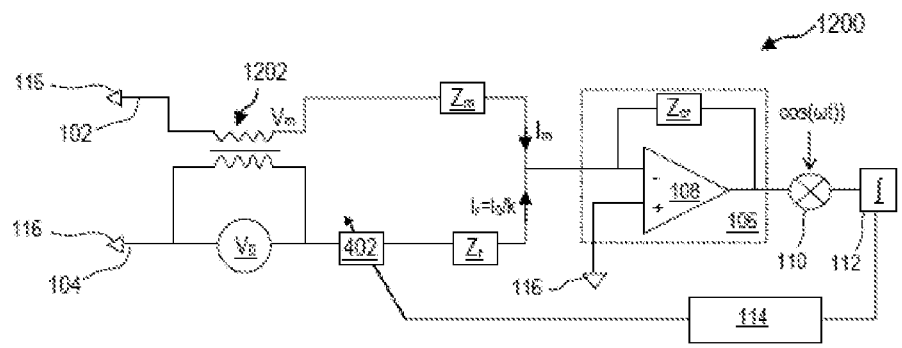

FIG. 12 is a diagrammatic representation of another embodiment example of an impedance measurement device according to the invention.

The impedance measurement device 1200 of FIG. 12 comprises all the elements of the device 400 of FIG. 4, with the exception of the measurement source $V_m$ of the measurement branch 102.

Unlike the device 400, in the device 1200 the measurement branch 102 is supplied by the alternating source of fixed amplitude $V_0$ by means of a transformer 1202, for example inductive.

Conversely, the reference branch 104 can be supplied by an alternating source present in the measurement branch, and a transformer 1202, for example inductive.

The device 1200 can be combined with each of the devices in FIGS. 4-11.

Figure 13:
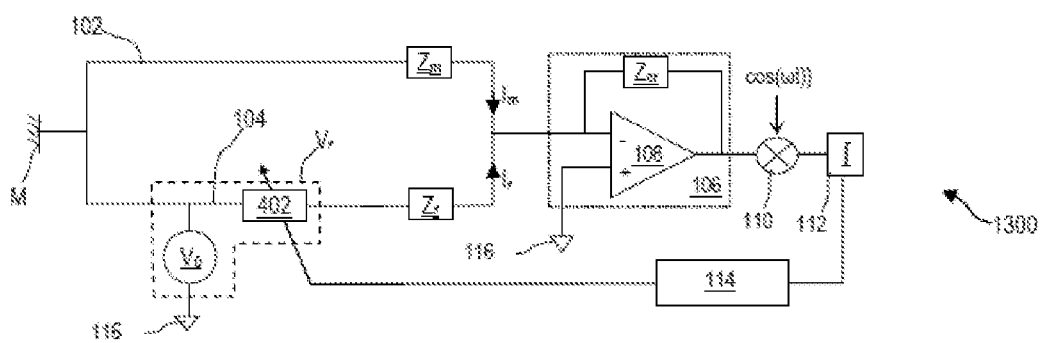

FIG. 13 is a diagrammatic representation of another embodiment example of an impedance measurement device according to the invention.

The impedance measurement device 1300 of FIG. 13 comprises all the elements of the device 400 of FIG. 4, with the exception of the source $V_m$.

Unlike the device 400, in the device 1300, the impedance to be measured $Z_m$ is connected to an electrical ground M, which can be a general ground such as earth for example, different from the reference potential 116 at the working frequency.

The fixed alternating voltage source $V_0$ supplies both the reference branch 104 and the measurement branch 102 via the common ground M. The source $V_0$ is then positioned between the reference potential 116 and the ground M and thus establishes this reference alternating electrical potential 116, which is different from the ground potential M at the working frequency. The other elements of the device 1300 that are shown, including in particular the detection electronics 106, can advantageously be supplied by power supplies referenced to the reference potential 116, in order to avoid the parasitic capacitances with the ground M.

Under these conditions, seen from the alternating electrical potential 116, the electrical ground M oscillates with respect to the reference potential 116. Under these conditions, and seen with respect to the reference potential 116, the measurement branch 102 is seen as being supplied by the fixed source $V_0$. For the same reasons as explained above, the impedance to be measured $Z_m$ is also polarized at the potential of this source $V_0$.

The reference branch 104 can also be supplied by the source $V_0$ associated with the gain stage 402, or by a source derived from the source $V_0$, for example through a resistive voltage divider or through a transformer as shown in FIG. 12.

The reference branch 104 can also be supplied by a separate source $V_r$, as shown in FIG. 3, in which case it is the source $V_m$ of the measurement branch that is positioned between the reference potential 116 and the ground M.

The configuration described with reference to FIG. 13 can be implemented in the device 500 of FIG. 5.

In addition, the configuration described with reference to FIG. 13 can be implemented in the device 600 of FIG. 6, by replacing the fixed source $V_0$ with the fixed source $V_r$ and by using the variable impedance $Z_r$ of FIG. 6.

Figure 14:
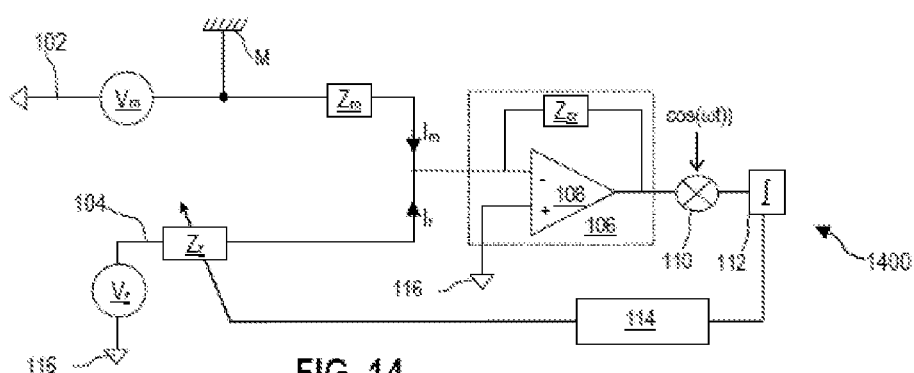

FIG. 14 gives an embodiment example of such a device, in a configuration in which the measurement branch 102 is supplied by a separate source $V_m$, positioned between the reference potential 116 and the ground M.

Generally, the device 1300 or 1400 can be combined with each of the devices in FIGS. 4-11.

In the case where the devices according to the invention, in particular the devices 1300 and 1400, are used for the capacitive detection of objects, the potential 116 can be an alternating potential, called guard potential, used to guard the measurement electrodes by guard electrodes. The use of such a guard potential is well known and will not be described in greater detail herein.

Figure 15:
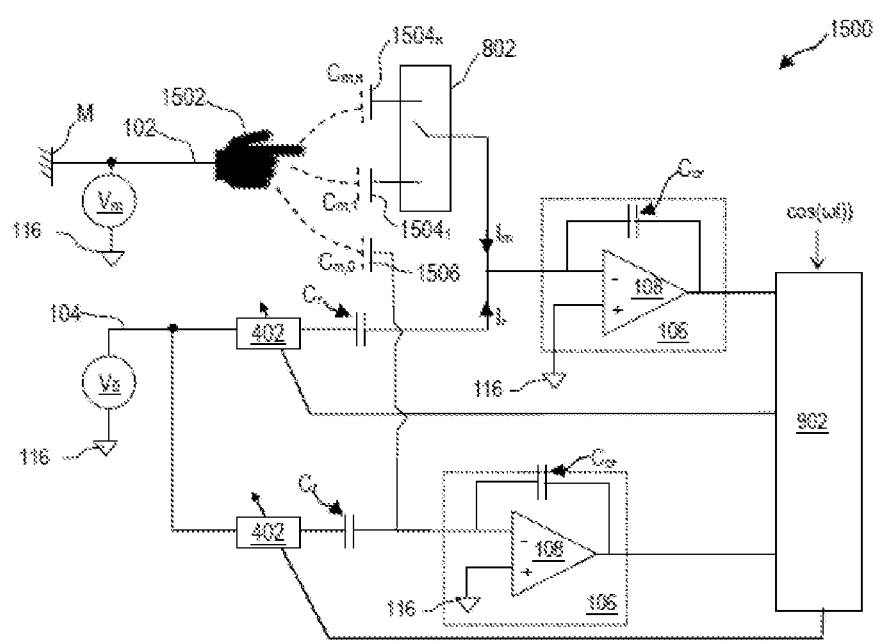
FIG. 15 is a diagrammatic representation of an embodiment example of a capacitive detection device according to the invention.

FIG. 15 is a diagrammatic representation of an embodiment example of a device for the capacitive detection of object(s).

The device 1500 shown in FIG. 15, is used to measure the capacitive impedance corresponding to each of the capacitances $C_{m,1}$-$C_{m,n}$, and $C_{m,0}$ formed between an object, and in particular a hand 1502 electrically referenced to the ground potential M, and a plurality of capacitive measurement electrodes, $1504_1$-$1504n$ and 1506 respectively.

As explained above with reference to FIGS. 4-6, the capacitive impedance $Z_{m,i}=(1/C_{m,i})$ is directly proportional to the distance between the object 1502 and the measurement electrode $1504_i$, and the capacitive impedance $Z_{m,0}=(1/C_{m,0})$ is directly proportional to the distance between the object 1502 and the measurement electrode 1506.

The device 1500 comprises a first measurement path with a polling means 802 making it possible to poll measurement electrodes $1504_1$-$1504n$ sequentially, as explained in FIG. 8a.

The device 1400 also comprises a second measurement path making it possible to poll a measurement electrode 1506 in parallel, as explained in FIG. 8b.

Of course, the device 1400 can also comprise only one sequential measurement path, or only parallel measurement paths, or a plurality of sequential and parallel paths.

The reference branches 104 of the first and the second measurement path are supplied by a common source $V_0$ with fixed amplitude, which supplies respectively gain stages 402 controlled by control variables k, as explained with respect to FIG. 4. The reference branches 102 of the first and the second measurement path are supplied by a source $V_m$ positioned between a ground M and the reference potential 116 (which is determined by this source $V_m$). In practice, the source $V_m$ is connected to the measurement branches 102 via the ground M and the object 1502.

Alternatively, the sources $V_0$ and $V_m$ of the reference and measurement branches can be realized by one and the same source, directly as shown in FIG. 13, or via a resistive voltage divider or a transformer as shown in FIG. 12.

On the measurement branch 102 of the first measurement path, the polling means 802 is used to measure, in turn, the value of the capacitive impedance $1/C_{m,i}$ for each of the measurement electrodes $1504_i$, as described with reference to FIG. 8a.

The reference branch 104 of the first and second paths comprises a purely capacitive reference impedance $1/C_r$ each formed by a capacitance $C_r$. In addition, the feedback impedance used for the transimpedance amplifier or in this case, charge amplifier 108 of the first and second paths is a purely capacitive impedance $1/C_{cr}$ and formed by a capacitance $C_{cr}$.

The device 1400 also comprises the microcontroller 902 integrating the synchronous demodulation unit 110, the integration unit 112 and the control module 114 of the first and second paths.

The transimpedance or charge amplifiers 108 and optionally the microcontroller 902 are supplied by power supplies referenced to the reference potential 116, to minimize the leakage capacitances.

It should be noted that, as explained above, all the capacitances to be measured $C_{m,i}$ are polarized at the same potential as the source $V_m$, which also corresponds to the reference potential 116 with respect to the ground M, and which can also be used as guard potential as explained with respect to the device 1400 of FIG. 14.

This property is very important because if all the capacitive measurement electrodes $1504_1$-$1504n$ and 1506 corresponding to the capacitances to be measured $C_{m,i}$ are polarized at one and the same reference potential 116, also used as guard potential to polarize elements in proximity to these electrodes according to well known implementations, and optionally also used as reference potential of the power supplies of the electronics as explained above, in this way capacitive detection electronics are obtained with an optimum sensitivity in which all the parasitic coupling capacitances and the leakage capacitances can be eliminated.

Of course, the capacitive detection device 1500 can utilize any combination of the devices described with reference to FIGS. 3-14.

The invention is not limited to the examples that have just been described, and numerous modifications may be made to these examples without exceeding the scope of the invention.

The invention claimed is:

1. An electronic impedance measurement device comprising:
   a branch, called measurement branch, comprising an impedance to be measured ($Z_m$); and
   at least one branch, called reference branch, comprising an impedance ($Z_r$), called reference impedance;
   electronics, called detection electronics, configured to provide an error signal ($V_s$) dependent on an algebraic sum of a current ($I_r$) flowing in the at least one reference branch and of a current ($I_m$) flowing in the measurement branch; and
   at least one means, called adjustment means, changing the current ($I_r$) in the at least one reference branch in a manner inversely proportional to a control variable (k); and
   a charge amplifier connected at a junction point of the measurement branch with the at least one reference branch, between the impedance to be measured ($Z_m$) and the at least one reference impedance ($Z_t$), and configured to provide the error signal ($V_s$) dependent on the algebraic sum of the current ($I_m$) of the measurement branch and of the current ($I_r$) of the at least one reference branch.

2. The device according to claim 1, characterized in that, for the at least one reference branch, the adjustment means is configured to change the amplitude of a voltage delivered to said reference branch, in a manner inversely proportional to the control variable (k).

3. The device according claim 2, characterized in that the adjustment means comprises an amplifier a gain of which varies in a manner inversely proportional to the control variable (k), and arranged downstream of a voltage source ($V_0$).

4. The device according to claim 2, characterized in that the adjustment means comprises:
   an amplifier; and
   at least one first digital potentiometer, used as input resistor of said amplifier, and the resistance of which is adjusted proportionally to the control variable (k).

5. The device according to claim 1, characterized in that, for at least one reference branch, the adjustment means is configured to change the reference impedance ($Z_r$) of the said reference branch, in a manner proportional to the control variable (k).

6. The device according to claim 5, characterized in that the adjustment means comprises:
   a set of at least two impedances arranged in series, and
   at least one, in particular several, controllable switch(es), each provided to short-circuit, or not, one of the said impedances.

7. The device according to claim 1, characterized in that it comprises:
   at least two reference branches comprising reference impedances ($Z_{r,1}, Z_{r,2}$) of different types; and/or
   at least two reference branches comprising reference impedances ($Z_{r,1}, Z_{r,2}$) of the same type; and supplied by signals in quadrature.

8. The device according to claim 1, characterized in that it also comprises, arranged downstream of the detection electronics, an amplitude demodulator.

9. The device according claim 1, characterized in that it also comprises, arranged downstream of the detection electronics, an amplifier with a gain proportional, and in particular equal, to the control variable (k).

10. The device according to claim 1, characterized in that the reference branch and the measurement branch are supplied by the same source ($V_0$), by use of a transformer.

11. The device according to claim 1, characterized in that:
    the impedance to be measured ($Z_m$) is referenced to a general ground (M), and
    the current ($I_r$) of the at least one reference branch is referenced to an alternating electrical potential, called reference potential, different from said general ground (M), at a working frequency;
    said device comprising an alternating voltage source ($V_0$) arranged between said reference potential and said general ground (M).

12. The device according to claim 1, characterized in that it is a capacitive impedance measurement device comprising an impedance to be measured ($C_{m,0}$-$C_{m,n}$) of essentially capacitive type.

13. The device according to claim 12, characterized in that it comprises a reference impedance ($C_r$) of essentially capacitive type.

14. A method for measuring impedance, in particular capacitive impedance, with an electronic impedance measurement device comprising:
    a branch, called measurement branch, comprising an impedance to be measured ($Z_m$);
    at least one branch, called reference branch, comprising an impedance ($Z_r$), called reference impedance;
    a step of obtaining, with detection electronics, an error signal ($V_s$) dependent on an algebraic sum of a current ($I_r$) flowing in the at least one reference branch and of a current ($I_m$) flowing in the measurement branch;
    at least one iteration of a step, called adjustment step, changing the current ($I_r$) in said at least one reference branch in a manner inversely proportional to a control variable (k); and
    a charge amplifier connected at a junction point of the measurement branch with the at least one reference branch, between the impedance to be measured ($Z_m$) and the at least one reference impedance ($Z_r$), and providing the error signal ($V_s$) dependent on the algebraic sum of the current ($I_m$) of the measurement branch and of the current ($I_r$) of the at least one reference branch.

15. A device for the capacitive detection of an object comprising:
    at least one electrode ($1504_1$-$1504_n$, $1506$), called measurement electrode, and
    at least one impedance measurement device according to claim 1, arranged to measure the capacitive impedance formed between said measurement electrode ($1504_1$-$1504_n$, $1506$) and said object.

16. The device according to claim 15, characterized in that an impedance measurement device is common to a plurality of measurement electrodes, said capacitive detection device comprising a polling means connecting said measurement device to each of said measurement electrodes, alternately.

17. An item of equipment for a robot, in particular removable or detachable, equipped with:
   at least one capacitive detection device according to claim 16; or
   at least one impedance measurement device including: a branch, called measurement branch, comprising an impedance to be measured ($Z_m$); and
   at least one branch, called reference branch, comprising an impedance ($Z_r$), called reference impedance; electronics, called detection electronics, configured to provide an error signal ($V_s$) dependent on an algebraic sum of a current ($I_r$) flowing in the at least one reference branch and of a current ($I_m$) flowing in the measurement branch; and
   at least one means, called adjustment means, changing the current ($I_r$) in the at least one reference branch in a manner inversely proportional to a control variable (k).

18. A robot equipped with:
   an item of equipment according to claim 17; or
   at least one impedance measurement device including: a branch, called measurement branch, comprising an impedance to be measured ($Z_m$); and
   at least one branch, called reference branch, comprising an impedance ($Z_r$), called reference impedance; electronics, called detection electronics, configured to provide an error signal ($V_s$) dependent on an algebraic sum of a current ($I_r$) flowing in the at least one reference branch and of a current ($I_m$) flowing in the measurement branch; and
   at least one means, called adjustment means, changing the current ($I_r$) in the at least one reference branch in a manner inversely proportional to a control variable (k).

19. The robot according to claim 18, equipped with a device for the capacitive detection of an object comprising:
   at least one electrode, called measurement electrode, and
   at least one impedance measurement device including a branch, called measurement branch, comprising an impedance to be measured ($Z_m$); and
   at least one branch, called reference branch, comprising an impedance ($Z_r$), called reference impedance;
   electronics, called detection electronics, configured to provide an error signal ($V_s$) dependent on an algebraic sum of a current ($I_r$) flowing in the at least one reference branch and of a current ($I_m$) flowing in the measurement branch; and
   at least one means, called adjustment means, changing the current ($I_r$) in the at least one reference branch in a manner inversely proportional to a control variable (k), arranged to measure the capacitive impedance formed between said measurement electrode and said object.

* * * * *